(12) United States Patent
Kato et al.

(10) Patent No.: US 7,109,649 B2
(45) Date of Patent: Sep. 19, 2006

(54) ORGANIC ELECTROLUMINESCENT COLOR DISPLAY UNIT

(75) Inventors: Yoshifumi Kato, Kariya (JP); Kazuyoshi Takeuchi, Kariya (JP); Ichiro Yamamoto, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 83 days.

(21) Appl. No.: 10/354,821

(22) Filed: Jan. 30, 2003

(65) Prior Publication Data

US 2003/0173895 A1 Sep. 18, 2003

(30) Foreign Application Priority Data

Jan. 31, 2002 (JP) ...................... 2002-022849

(51) Int. Cl.
*H01J 1/62* (2006.01)

(52) U.S. Cl. ............... 313/504; 315/169.3; 313/512

(58) Field of Classification Search ............... 313/504, 313/503, 505, 506, 507, 511, 512; 315/169.3
See application file for complete search history.

(56) References Cited

U.S. PATENT DOCUMENTS

| | | | | |
|---|---|---|---|---|
| 3,639,840 A | * | 2/1972 | Shekel et al. | 725/151 |
| 5,589,732 A | * | 12/1996 | Okibayashi et al. | 313/506 |
| 5,864,206 A | * | 1/1999 | Ishihara et al. | 313/506 |
| 5,909,081 A | * | 6/1999 | Eida et al. | 313/504 |
| 5,920,080 A | * | 7/1999 | Jones | 257/40 |
| 6,008,578 A | * | 12/1999 | Chen | 313/506 |
| 6,075,317 A | * | 6/2000 | Keyser et al. | 313/505 |
| 6,117,529 A | * | 9/2000 | Leising et al. | 428/209 |
| 6,392,340 B1 | * | 5/2002 | Yoneda et al. | 313/506 |
| 6,452,341 B1 | * | 9/2002 | Yamauchi et al. | 315/169.1 |
| 6,461,885 B1 | * | 10/2002 | Lupo et al. | 438/29 |
| 6,590,337 B1 | * | 7/2003 | Nishikawa et al. | 313/509 |
| 6,641,933 B1 | * | 11/2003 | Yamazaki et al. | 428/690 |
| 6,724,011 B1 | * | 4/2004 | Segawa et al. | 257/72 |
| 6,774,574 B1 | * | 8/2004 | Koyama | 315/169.3 |
| 6,833,668 B1 | * | 12/2004 | Yamada et al. | 313/505 |
| 6,864,638 B1 | * | 3/2005 | Ishihara et al. | 315/169.3 |
| 2001/0026123 A1 | * | 10/2001 | Yoneda | 313/504 |
| 2001/0043043 A1 | * | 11/2001 | Aoyama et al. | 313/506 |
| 2001/0050532 A1 | * | 12/2001 | Eida et al. | 313/504 |
| 2002/0021087 A1 | * | 2/2002 | Eida et al. | 313/504 |
| 2002/0125817 A1 | * | 9/2002 | Yamazaki et al. | 313/498 |
| 2004/0150762 A1 | * | 8/2004 | Segawa et al. | 349/43 |

FOREIGN PATENT DOCUMENTS

| | | |
|---|---|---|
| JP | 07-220871 | 8/1995 |
| JP | 08-222369 | 8/1996 |
| JP | 08-321380 | 12/1996 |
| JP | 10-074585 | 3/1998 |
| JP | 10-116687 | 5/1998 |
| JP | 11-185955 | 7/1999 |
| JP | 2000-077191 | 3/2000 |
| JP | 2000-173766 | 6/2000 |
| JP | 2001-126862 | 5/2001 |
| JP | 2001-217072 | 8/2001 |
| JP | 2001-345179 | 12/2001 |

* cited by examiner

*Primary Examiner*—Vip Patel
*Assistant Examiner*—Glenn Zimmerman
(74) *Attorney, Agent, or Firm*—Morgan & Finnegan, LLP

(57) ABSTRACT

An organic light emitting diode color display unit has a substrate, an organic electroluminescent device formed on the substrate, a transparent cover plate disposed opposite to the substrate and a color filter element formed on the transparent cover plate. The organic electroluminescent device includes an electroluminescent zone comprising a thin film of an organic electroluminescent material. The color filter element is spaced from the organic electroluminescent device and associated with the organic electroluminescent device. Light from the organic electroluminescent device is emitted from the transparent cover plate.

10 Claims, 2 Drawing Sheets

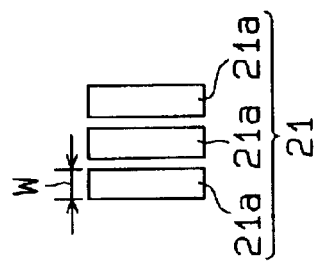
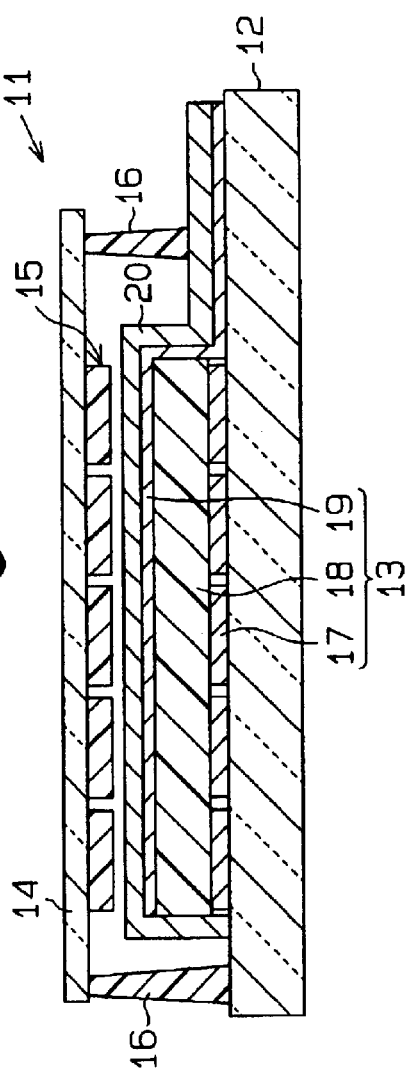
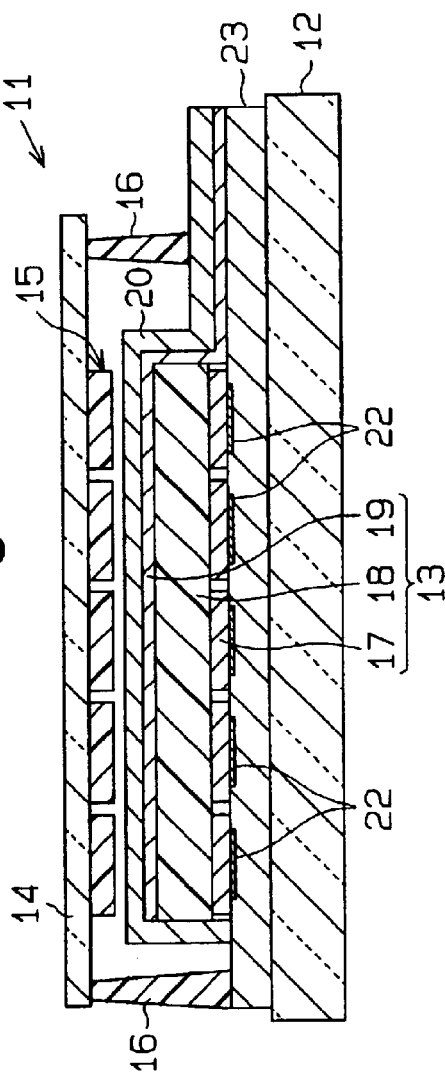

ORGANIC ELECTROLUMINESCENT COLOR DISPLAY UNIT

BACKGROUND OF THE INVENTION

The present invention relates to an organic electroluminescent color display unit. In particular, the invention relates to an organic light emitting diode (herein after referred to as OLED) color display unit having a light emitting layer comprising an organic electroluminescent material.

Recently color display units using OLED attract attention for their superior display performance. However, methods for manufacturing OLED display devices, in which light emitting layers are formed for each of red, green, and blue, are complicated, resulting in high production cost. Further, it is difficult to produce such display units with high resolution and into large area.

In order to solve the problem, a color display unit having only white light emitting layers is suggested. In this case, desired display colors are obtained by using a color filter.

Referring to FIG. 4, a color display unit 51 comprises a color filter structure 53 which comprises color filter elements 53a and a planarization film 53b formed over a glass substrate 52. An anode 54, an organic electroluminescent layer 55 and a cathode 56 are laminated over the color filter structure 53 in succession. A shielding cover 57 for covering these is adhered to the substrate 52. The shielding cover 57 is disposed to shield from ambient air the organic electroluminescent layer 55, which is reactive to oxygen and moisture. A getting material 57a is accommodated within the shielding cover 57. The gettering material refers to a substance that is disposed for absorbing components, such as moisture and oxygen, that degrades the organic electroluminescent layer 55. An absorbent, a desiccant, or an oxygen absorbent or the like is used solely or in combination.

However, the color filter elements 53a are generally contains an organic pigment. The organic pigment and/or a transparent resin in which the pigment is dispersed contain moisture. Further, the planarization film 53b disposed over the color filter elements 53a also contains moisture. Accordingly, the organic electroluminescent layer 55 was degraded by trace moisture and oxygen that are released from the color filter structure 53 and that penetrated into the organic electroluminescent layer 55. Further the organic electroluminescent layer 55 was also degraded by formation of corrosive gases, such as chlorine gas, in some materials used for the planarization film 53b.

In active matrix display units, it was necessary to form a thin film transistor (TFT) drive circuit over the color filter structure 53. However, heat generated through production of the thin film transistors damaged the color filter structure 53.

Referring to FIG. 5, Japanese Laid-Open Patent Publication 10-116687 disclosed an organic electroluminescent display unit 61 in which deterioration of organic electroluminescent devices by the above described organic pigments is suppressed. The electroluminescent display unit 61 includes an inorganic color filter 60 between a substrate 52 and a transparent electrode 58 as shown in FIG. 5. The inorganic color filter 60 is disposed at a position associated with an organic electroluminescent device 59 and is covered by a protection layer 62. The protection layer 62 protects the inorganic color filter 60 during an etching process of the transparent electrode 58, as well as planarizes the steps of the inorganic color filter 60.

However, the applicable colors are limited in the case where an inorganic color filter is used. Accordingly, in order to reproduce colors flexibly in a color display unit, it is necessary to use an organic color filter. In such cases, problems of moisture and gas components penetrated from the color filter structure 53 arise as described above.

Further, the color filter has pixels which is respectively colored to red (R), green (G), and blue (B). The steps, which are formed between different colored dyes, are flattened by providing a planarization film formed from resin on the color filter elements. However, the color filter and the planarization film are relatively thick compared to the organic electroluminescent layer. Accordingly, regions that can be a local curvature in comparison with a thickness of a thin organic electroluminescent layer are formed, while the step may not be assumed as a curvature in comparison with a thickness of the color filter and the planarization film. As a result, an anode and a cathode, which are disposed by interposing a thin organic electroluminescent layer, can be short-circuited in the case where the organic electroluminescent device is formed on a planarization film that covered the color filter as disclosed in conventional art. This reduced reliability of the display unit as well as reducing the yield ratio. The problem of the planarization occurs regardless of the use of an organic color filter or an inorganic color filter.

BRIEF SUMMARY OF THE INVENTION

An object of the invention is to provide an OLED color display unit dispensable of a planarization film as well as improving reliability of the display unit. Another object of the invention is to provide an organic light emitting display unit, in which degradation of an organic electroluminescent layer due to moisture and gas components that occur from the color filter when an organic color filter is used, is reduced.

In order to achieve above objects, the present invention provides an organic light emitting diode color display unit comprising:

a substrate;

an organic electroluminescent device formed on the substrate, wherein the organic electroluminescent device includes an electroluminescent zone comprising a thin film of an organic electroluminescent material;

a transparent cover plate disposed opposite to the substrate; and a color filter element formed on the transparent cover plate, wherein said color filter element is spaced away from the organic electroluminescent device and associated with the organic electroluminescent device, wherein light from the organic electroluminescent device is emitted from the transparent cover plate.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of-the presently preferred embodiments together with the accompanying drawings in which:

FIG. 1A is a schematic cross-sectional view of an organic light emitting display unit according to an embodiment of the invention.

FIG. 1B is a schematic cross-sectional view of a pixel.

FIG. 2 is a schematic cross-sectional view of an organic light emitting display unit according to another embodiment of the invention.

DETAILED DESCRIPTION OF THE PREFERRED EMBODIMENTS

Figure 3:
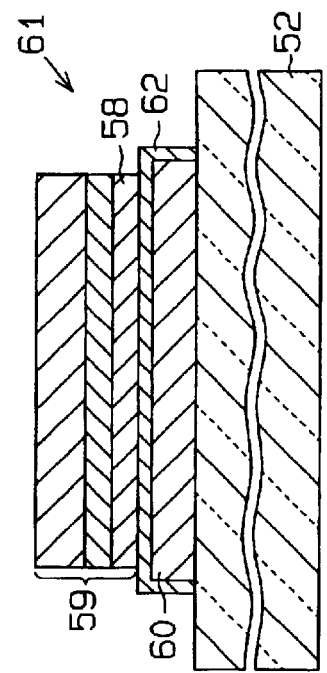
FIG. 3 is a schematic cross-sectional view of an organic light emitting display unit according to still another embodiment of the invention.

A first embodiment of the invention is described by referring to FIGS. 1A and 1B. The first embodiment relates to a passive matrix OLED color display unit. FIG. 1A is a schematic cross sectional view of an OLED color display unit. A passive matrix OELD color display unit consists in general of a grid of horizontal and vertical electrodes. The intersection of the electrodes is a subpixel.

As shown in FIG. 1A, an organic light emitting diode color display unit 11 comprises a substrate 12 including an organic electroluminescent device 13 formed thereon and a color filter formed on a transparent cover plate 14 as a separate member from the substrate 12. The color filter is provided associated with and vertically spaced from an organic electroluminescent device 13. Light from the organic electroluminescent device 13 is emitted through the cover plate 14.

The cover plate 14 is adhered to the substrate 12 by a sealant 16. Accordingly, the organic electroluminescent device 13 is enclosed by the substrate 12, the sealant 16, and the cover plate 14 and insulated from the outside air. The substrate 12 and the cover plate 14 are formed from a glass plate, for example. The sealant 16 is formed, for example, from an epoxy resin.

The organic electroluminescent device 13 is formed of subpixels. The organic light emitting diode color display unit further comprises a first electrode layer 17, an organic electroluminescent zone 18, and a second electrode layer 19 that are successively formed on the substrate 12. In this embodiment, the first electrode layer 17 is an anode and the second electrode layer 19 is a cathode. The organic electroluminescent device 13 is covered by a passivation film 20 on the entire surface, except for a surface on which it contacts the substrate 12. The passivation film 20 comprises a material that prevents permeation of moisture, such as silicon nitride $SiN_x$ or silicon oxide $SiO_x$.

The first electrode layer 17 comprising chromium (Cr) comprises first stripes extending in a first direction on a surface of the substrate 12. The first electrode layers 17 extend in a direction orthogonally to the plane of FIG. 1A. The organic electroluminescent zone 18 is formed into a plurality of parallel stripes that extend orthogonal to the first electrode layers 17. Each stripe is insulated by at least one wall not shown in the figures.

The second electrode layer 19 comprises second stripes extending in a second direction perpendicular to the first direction. The second stripes are laminated on the organic electroluminescent zones 18, which are formed into stripes to be orthogonal to the first electrode layer 17. A subpixel, which constitutes a part of the organic electroluminescent device 13, is formed at an area where the first electrode layer 17 and the second electrode layer 19 overlap. A part of the first electrode layer 17, the electroluminescent zone 18, and the second electrode layer 19, that is disposed in the area where the first electrode layer 17 and the second electrode layer 19 overlap forms a subpixel, and the intersection of electrodes serves as a switch for driving the part of the electroluminescent zone 18. In this way, a plurality of subpixels is provided in a matrix over the substrate 12. The second electrode layer 19 is transparent and comprises indium tin oxide (ITO) in this embodiment to allow transmission there through of the light emitted from the organic electroluminescent zone 18.

Any structure known in the art as an OLED structure can be used for the organic electroluminescent zone 18. It may be for example, a three-layered structure of a hole injection layer, a light emitting layer, and an electron injection layer laminated in this order from the first electrode layer 17. The organic electroluminescent zone 18 comprises an electroluminescent structure emitting white light. As shown in FIG. 1B, each pixel 21 is formed from three subpixels 21a. An intersecting area of the first electrode layer 17 and the second electrode layer 12 forms the subpixel 21a.

Since an organic color filter is adopted in this embodiment, an organic material is used for forming each color filter element 15. Each color filter element 15 of red (R), green (G), and blue (B) of the color filter respectively corresponds to the each subpixel 21a.

In manufacture of the OLED color display unit 11, the organic electroluminescent device 13 is formed on the substrate 12 and the color filter elements 15 are formed on the cover plate 14 separately from the substrate 12. The cover plate 14 is adhered to the substrate 12 through the sealant 16 while the color filter (not shown in the figures) is associated with the organic electroluminescent device 13 and a space is held between the organic electroluminescent device 13 and the color filter. The space, which is enclosed by the substrate 12, the sealant 16, and the cover plate 14, is filled with an inert substance such as nitrogen gas which is not reactive.

In operation, a subpixel 21a emits white light when a voltage is applied between an area at which the electrode layers 17 and 19 intersect and which corresponds to the subpixel 21a. The white light is colored by transmission through any of the color filter elements of red (R), green (G), and blue (B). Various display colors are produced through combination of red (R), green (G), and blue (B).

Since a conventional organic electroluminescent device was successively laminated onto the color filter by interposing the planarization film, moisture or gas components (mainly oxygen) that were radiated from the color filter or the planarization film deteriorated the organic electroluminescent layer. However, since the organic electroluminescent device 13 is provided spaced away from the color filter elements 15 in the present invention, deterioration of the organic electroluminescent zone 18 due to moisture and gas components radiated from the color filter elements 15 is suppressed.

Figure 4:
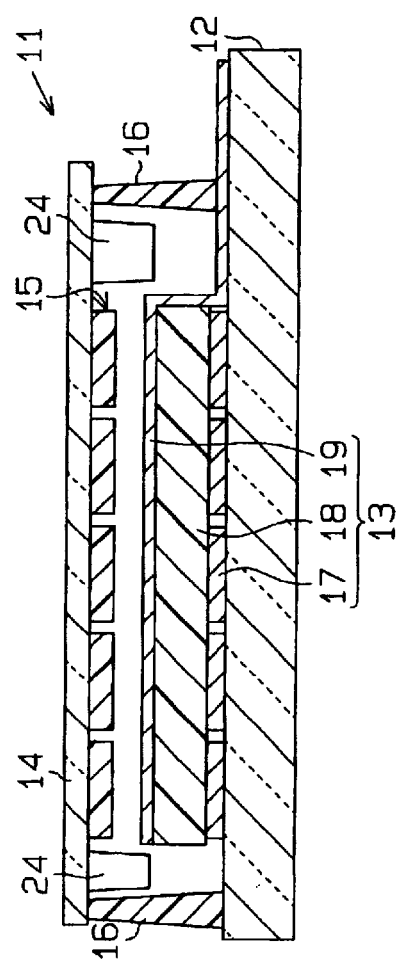
FIG. 4 is a schematic cross-sectional view of a conventional organic light emitting display unit.
Figure 5:
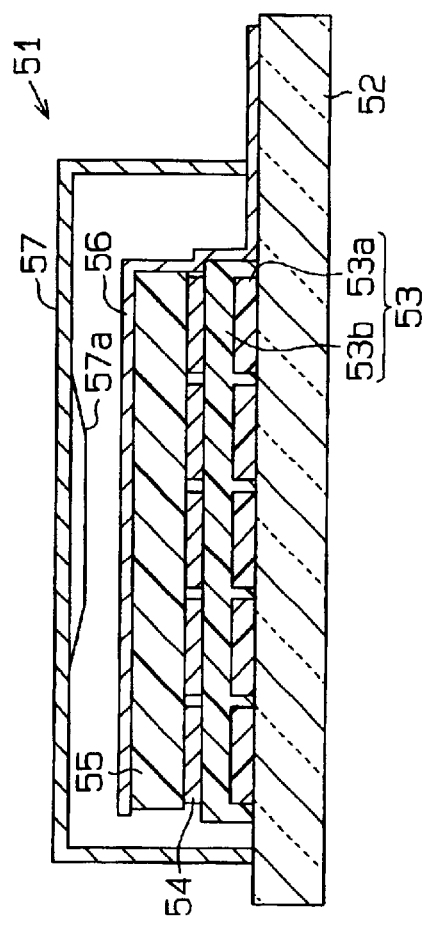
FIG. 5 is a schematic cross-sectional view of another conventional organic light emitting display unit.

The rate of deterioration of one pixel 21 in the organic electroluminescent device 13 to the time is compared between the OLED color display unit 11 of this embodiment (example) and a conventionally formed OLED color display unit (comparative example) shown in FIG. 4. The deterioration phenomenon which occurs due to moisture and gas component from the periphery (generation of dark area) is measured by the change in illuminating width W of a subpixel 21a shown in FIG. 1B. The result is shown in Table 1.

TABLE 1

| | Illuminating Width (μm) | | Rate of Decrease (%) |
|---|---|---|---|
| | Initial | After 1000 hours at room temperature | |
| Example | 96 | 93 | 3.1 |
| Comparative Example | 92 | 62 | 32.6 |

While the propagation of the dark area in the example was slow to maintain sufficient illuminating width W after 1000 hours at room temperature, the dark area in the comparative example propagated to greatly decrease the illuminating width W by deterioration of the organic electroluminescent zone 18 due to moisture etc. The rate of decrease in the illuminating width W was approximately 3% in the example, whereas the rate of decrease in the illuminating width W was approximately 33% in the comparative example, which is ten times higher.

According to the OLED display unit-shown in FIG. 1A, the risk of short circuit between the electrode layers 17 and 19 that are formed by interposing an organic electroluminescent zone is reduced and the reliability of the unit is improved regardless of thin organic electroluminescent zone 18 since the organic electroluminescent device 13 is formed on a flat surface. Further, a conventional planarization film for planarizing the steps of the color filter elements 15 is dispensable so that the production cost is reduced.

Further, since the organic electroluminescent device 13 is not in contact with the color filter elements 15, the deterioration of the organic electroluminescent zone 18 caused by moisture and gas components from the color filter elements 15 can be suppressed.

The use of a white light emitting layer provides three original colors of light when a color filter of red, green, and blue is formed. Accordingly, the structure of the color filter is simple compared to the case where necessary three original colors are obtained by combination of a light other than white (blue light for example) with color changing layers.

The use of organic color filter enables good reproduction of colors compared to the case where inorganic color filter is used.

By providing passivation film 20 to cover the organic electroluminescent device 13, the organic electroluminescent device 13 may not be effected by moisture and gas component occurred in the color filter.

The cover plate 14 and the sealant 16 of FIG. 1A act to insulate the organic electroluminescent device 13 from ambient air to prevent degradation of the organic electroluminescent zone 18 due to moisture and gas component from the environment in which the OLED color display unit 11 is used.

It is not necessary that the substrate 12 and the first electrode layer 17 be formed from a translucent material to increase freedom of materials since light emitted from the organic electroluminescent device is directed toward the cover plate 14.

In the case where the first electrode layer 17 is formed from a metallic layer (chromium layer in this embodiment), an amount of light emitted from the cover plate 14 can be increased because the light propagating from the organic electroluminescent zone 18 toward the substrate 12 is reflected with efficiency.

A second embodiment of the invention is next described by referring to FIG. 2. The structure of this embodiment is substantially the same except that the display unit of this embodiment comprises thin film transistors (TFT) for active driving elements in an active matrix display unit. In an active matrix display unit, thin film transistors, which serve as active driving elements, are located such that each active driving element is associated with a subpixel. Similar parts in the display unit have the same reference numerals and the description of these is omitted to simplify the description.

A circuit layer 23 comprising a thin film transistor 22 is formed on the substrate 12 as an active drive element. Thin film transistors 22 are formed in association with the subpixels 21a of the organic electroluminescent device 13. In this embodiment, the first electrode layer 17, which constitutes a part of the organic electroluminescent device 13, covers each corresponding thin film transistor 22.

In this embodiment, the organic electroluminescent device 13 is formed similarly to the first embodiment on the circuit layer 23 after the circuit layer 23 including thin film transistors 22 is formed on the substrate. Accordingly, the OLED display unit shown in FIG. 2 has the similar advantages as described above with respect to FIG. 1A.

In FIG. 2, the circuits including thin film transistors 22 are formed on the substrate 12 independently from the color filter element 15, unlike conventional active matrix OLED devices in which the circuits are formed on the color filter.

By applying active matrix driving method, cross-talk between the pixels is prevented so that high quality display can be obtained compared to passive matrix displays in the case where the number of pixels increased.

In the case where it is not necessary to form the circuits including thin film transistors 22 on the color filter, the color filter is not damaged by heat generated in the course of manufacturing thin film transistors 22. Accordingly, circuits including thin film transistors 22 can be formed through techniques known in the art of producing liquid crystal active matrix display units. In other words, specific means to eliminate damage of the color filter due to heat is not necessary.

Because the direction in which light emitted from the organic electroluminescent device 13 of FIG. 2 propagates is opposite to the substrate 12, it is not necessary to take measures for avoiding overlap of the organic electroluminescent device 13 forming region and the thin film transistor 22 forming region. A pixel electrode on the substrate 12 side (first electrode layer 17) is formed to cover the thin film transistor 22. Accordingly, the area for the organic electroluminescent device 13 can be allocated larger compared to the case where the organic electroluminescent device 13 and the thin film transistor 22 are formed on the same plane.

It should be apparent to those skilled in the art that the present invention may be embodied in many other specific forms without departing from the spirit or scope of the invention. Particularly, it should be understood that the invention may be embodied in the following forms.

As shown in FIG. 3, gettering material 24 may be accommodated in the space enclosed by the substrate 12, the sealant 16, and the cover plate 14, instead of covering the organic electroluminescent device 13 by the passivation film 20 to prevent degradation of the organic electroluminescent zone 18 due to moisture and oxygen from the environment in which the OLED color display device 11 is used. The gettering material 24 is disposed at a position where the emitted light directed from the organic electroluminescent zone 18 toward the cover plate 14 is not intercepted. The gettering material 24 here refers to a substance that is disposed for absorbing components such as moisture that effects the organic electroluminescent zone 18. An absorbent, a desiccant, or an oxygen absorbent or the like is used solely or in combination. In this case the cover plate 14 and the sealant 16 act to shield the organic electroluminescent device 13 from the ambient air so that the degradation of the organic electroluminescent zone 18 due to moisture or gas components can be prevented in an environment in which the OLED color display unit 11 is used. The moisture and oxygen that are generated from the color filter absorbed into the gettering material 24.

As an alternative of filling inert gas into the space enclosed by the substrate 12, the sealant 16, and the cover plate 14, an inert liquid to which water is not soluble, such as Freon etc., can be filled. In this case, the heat conductivity is higher to facilitate releasing heat generated by the device.

In the case where the organic electroluminescent device 13 is covered by the passivation film 20, the color filter may be disposed spaced away from the organic electroluminescent device 13 without limiting the structure to adhere the cover plate 14 onto the substrate 12 through the sealant 16. Color filter elements 15 are formed on the cover plate 14.

The organic electroluminescent zone 18 is not limited to those emitting white light. It may alternatively be a blue light emitting layer. In such case, the light transmitted through the color filter corresponds to red (R), green (G), and blue (B) by using a color filter having color changing layers as the color filter elements 15. Accordingly, various display colors may be reproduced from light emitting layers of a single color.

Since the substrate 12 is not necessarily translucent, the material used for which is not limited to glass. The material may be opaque, such as ceramics or metal. A flexible substrate such as resin, etc., may be used for the substrate 12.

The material used for the first electrode layer 17 disposed on the substrate 12 side is not limited to chromium. It may be other metals for example aluminum, or it may be a transparent electrode such as indium tin oxide (ITO) or ceramics electrode.

Among two electrodes that constitute the organic electroluminescent device 13, the electrode disposed on the substrate 12 side (the first electrode layer 17) is formed with translucency so that the reflectance of the substrate is smaller than the reflectance of the metal electrode. The reflectance of the metal electrode is for example 30% or less and preferably 10% or less. By forming the surface of the substrate 12 black, the reflectance of the substrate can be made 10% or less. By providing an aluminum plate on which alumite processing is performed as the substrate 12, the surface can be easily provided with black color. In this structure, the rate of reflectance of light coming from the outside is reduced in the use under the open air to improve the contrast.

The first electrode layer 17 may be provided as a cathode and the second electrode layer 19 may be provided as an anode.

The cover plate 14 may be any plate if it is translucent. The material for which is not limited to glass and translucent resin (acrylic resin for example) may be used.

The material for the passivation film 20 is not limited to silicon nitride $SiN_x$ or silicon oxide $SiO_x$. Other transparent materials having low permeating rate for gas such as moisture and oxygen, diamond-like-carbon for example, may be used.

In an OLED display unit in which the organic electroluminescent device 13 is driven by active matrix, the active matrix driving element and the organic electroluminescent device 13 may be disposed on the same plane. In this case however, since the active driving element and the organic electroluminescent device 13 can not be formed to correspond each other, it is preferable that the organic electroluminescent device 13 is formed on the active driving element (thin film transistor 22).

As an alternative to thin film transistor 22, a metal-insulator-metal (MIM) device may be used as an active driving element.

Therefore, the present examples and embodiments are to be considered as illustrative and not restrictive and the invention is not to be limited to the details given herein, but may be modified within the scope and equivalence of the appended claims.

What is claimed is:

1. An organic light emitting diode color display unit comprising:

a substrate;

a circuit layer formed on the substrate, wherein the circuit layer includes a plurality of active driving elements;

an organic electroluminescent device formed on the circuit layer and comprising subpixels, wherein each active driving element is positioned in association with one of the subpixels to drive the associated subpixel, wherein the organic electroluminescent device includes first electrodes located on the circuit layer that completely cover the active driving elements, second electrodes spaced apart from the first electrodes, and an electroluminescent zone located between the first electrodes and the second electrodes, the electroluminescent zone comprising a thin film of an organic electroluminescent material;

a transparent cover plate disposed opposite to the substrate; and color filter elements formed on the transparent cover plate, wherein said color filter elements are spaced away from the organic electroluminescent device and are positioned associated with the subpixels of the organic electroluminescent device, wherein light from the organic electroluminescent device is emitted from the transparent cover plate.

2. An organic light emitting diode color display unit according to claim 1, wherein the electroluminescent zone emits white light.

3. An organic light emitting diode color display unit according to claim 1, wherein the color filter elements are formed of an organic material.

4. An organic light emitting diode color display unit according to claim 1, wherein the organic electroluminescent device is covered with a passivation film.

5. An organic light emitting diode color display unit according to claim 1 wherein the transparent cover plate is adhered to the substrate by way of a sealant to accommodate a gettering material in a space enclosed by the substrate, the sealant, and the cover plate.

6. An organic light emitting diode color display unit comprising:

a substrate;

a circuit layer formed on the substrate, wherein the circuit layer includes a plurality of active driving elements;

an organic electroluminescent device formed on the circuit layer and comprising subpixels, wherein each active driving element is positioned in association with one of the subpixels to drive the associated subpixel, wherein the organic electroluminescent device includes a first electrode layer located on the circuit layer, a second electrode layer spaced apart from the first electrode layer, and an electroluminescent zone located between the first electrode layer and the second electrode layer, the electroluminescent zone comprising a thin film of an organic electroluminescent material, wherein the first electrode layer includes first stripes extending in a first direction and the second electrode layer includes second stripes extending in a second direction perpendicular to the first direction, wherein the first stripes and the second stripes overlap, and wherein the overlanping parts of the first and the second stripes are associated with the subpixels, and wherein the first stripes completely cover the active driving elements;

a transparent cover plate disposed opposite to the substrate; and color filter elements formed on the transparent cover plate, wherein said color filter elements are spaced away from the organic electroluminescent device and are positioned associated with the subpixels of the organic electroluminescent device, wherein light from the organic electroluminescent device is emitted from the transparent cover plate.

7. An organic light emitting diode color display unit according to claim 6, wherein the electroluminescent zone emits white light.

8. An organic light emitting diode color display unit according to claim 6, wherein the color filter elements are formed of an organic material.

9. An organic light emitting diode color display unit according to claim 6, wherein the organic electroluminescent device is covered with a passivation film.

10. An organic light emitting diode color display unit according to claim 6 wherein the transparent cover plate is adhered to the substrate by way of a sealant to accommodate a gettering material in a space enclosed by the substrate, the sealant, and the cover plate.

* * * * *